(12) United States Patent
Chueh et al.

(10) Patent No.: US 12,243,606 B2
(45) Date of Patent: Mar. 4, 2025

(54) SEMICONDUCTOR DEVICE, MEMORY SYSTEM AND METHOD OF CONTROLLING SEMICONDUCTOR DEVICE THEREOF

(71) Applicant: AP MEMORY TECHNOLOGY CORPORATION, Hsinchu County (TW)

(72) Inventors: Hsin-Nan Chueh, Hsinchu County (TW); Wenliang Chen, Hsinchu County (TW); Chin-Hung Liu, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 309 days.

(21) Appl. No.: 17/483,508

(22) Filed: Sep. 23, 2021

(65) Prior Publication Data

US 2022/0208295 A1 Jun. 30, 2022

Related U.S. Application Data

(60) Provisional application No. 63/132,484, filed on Dec. 31, 2020.

(51) Int. Cl.
*G11C 29/44* (2006.01)
*G06F 11/16* (2006.01)
*G11C 29/42* (2006.01)
*H01L 23/00* (2006.01)

(52) U.S. Cl.
CPC ...... *G11C 29/4401* (2013.01); *G06F 11/1666* (2013.01); *G11C 29/42* (2013.01); *H01L 24/14* (2013.01); *G11C 2029/4402* (2013.01); *H01L 2924/1434* (2013.01); *H01L 2924/15311* (2013.01)

(58) Field of Classification Search
CPC ............... G11C 29/4401; G11C 29/42; G11C 2029/4402; G06F 11/1666; H01L 24/14; H01L 2924/1434; H01L 2924/15311
See application file for complete search history.

(56) References Cited

U.S. PATENT DOCUMENTS

| | | | | |
|---|---|---|---|---|
| 5,740,349 A | * | 4/1998 | Hasbun | G11C 29/765 |
| | | | | 714/6.13 |
| 5,856,708 A | * | 1/1999 | Wollesen | H10B 10/00 |
| | | | | 257/E27.098 |
| 6,728,910 B1 | * | 4/2004 | Huang | G11C 29/16 |
| | | | | 365/201 |
| 2004/0162959 A1 | * | 8/2004 | Adelmann | G11C 16/20 |
| | | | | 711/202 |

(Continued)

*Primary Examiner* — Kalpit Parikh
(74) *Attorney, Agent, or Firm* — WPAT, P.C.; Anthony King

(57) ABSTRACT

A memory device includes a memory die, a non-volatile memory circuit, and a logic die. The memory die includes a first memory space and a second memory space. The non-volatile memory circuit stores a repair table file corresponding to the first memory space. The logic die is coupled to the memory die and the non-volatile memory. The logic die selectively accesses the first memory space or the second memory space of the memory die according a comparing result of an input address and the repair table file. The memory die and is different from the logic die.

17 Claims, 10 Drawing Sheets

(56) References Cited

U.S. PATENT DOCUMENTS

| | | | |
|---|---|---|---|
| 2013/0326312 A1* | 12/2013 | Lee | G06F 12/0246 |
| | | | 714/773 |
| 2014/0013185 A1 | 1/2014 | Kobla et al. | |
| 2014/0281686 A1 | 9/2014 | Ware | |
| 2015/0037914 A1 | 2/2015 | Takahashi et al. | |
| 2015/0380109 A1* | 12/2015 | Jeddeloh | G11C 29/789 |
| | | | 714/6.13 |
| 2018/0358111 A1 | 12/2018 | Jeddeloh et al. | |
| 2019/0042375 A1* | 2/2019 | Bradshaw | G06F 3/0679 |

\* cited by examiner

SEMICONDUCTOR DEVICE, MEMORY SYSTEM AND METHOD OF CONTROLLING SEMICONDUCTOR DEVICE THEREOF

PRIORITY CLAIM AND CROSS-REFERENCE

This application claims the benefit of prior-filed U.S. provisional application No. 63/132,484, filed Dec. 31, 2020, and incorporates its entirety herein.

TECHNICAL FIELD

The present disclosure relates to a memory device, and more particularly, to a memory device using repair table files.

DISCUSSION OF THE BACKGROUND

Static random-access memory (SRAM) and dynamic random-access memory (DRAM) are two types of memory that are commonly used for temporarily storing data during the operation of computer system. While SRAM generally provides higher access speeds than DRAM, a DRAM cell can be implemented with a simpler structure, and thus, is more cost effective. Therefore, DRAM is often adopted for applications requiring a large memory capacity. However, as the memory capacity of DRAM increases, issues of reliability also arise.

To improve the reliability of the DRAM, a repair mechanism has been proposed. However, logic operations introduced by the repair mechanism may reduce performance and increase power consumption of the DRAM. Therefore, there is a need to improve the reliability of the DRAM without reducing the performance of the DRAM.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device. The memory device includes a memory die, a non-volatile memory circuit, and a logic die. The memory die includes a first memory space and a second memory space. The non-volatile memory circuit is configured to store a first repair table file corresponding to the first memory space. The logic die is coupled to the first memory die and the non-volatile memory circuit, and the logic die is configured to selectively access the second memory space or the first memory space of the first memory die according to a comparing result of an input address and the first repair table file. The first memory die is different from the logic die.

Another aspect of the present disclosure provides a memory system. The memory system includes the memory device and a controller. The controller is configured to generate the input address to the memory device and overwrite the first repair table file in the non-volatile memory circuit with an updated repair table file.

Another aspect of the present disclosure provides a method of controlling a memory device. The method comprises providing a memory die including a first memory space and a second memory space, generating a repair table file corresponding to the first memory space, and providing a logic die to selectively access the second memory space or the first memory space of the memory die according to a comparing result of an input address and the repair table file, wherein the logic die is different from the memory die.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
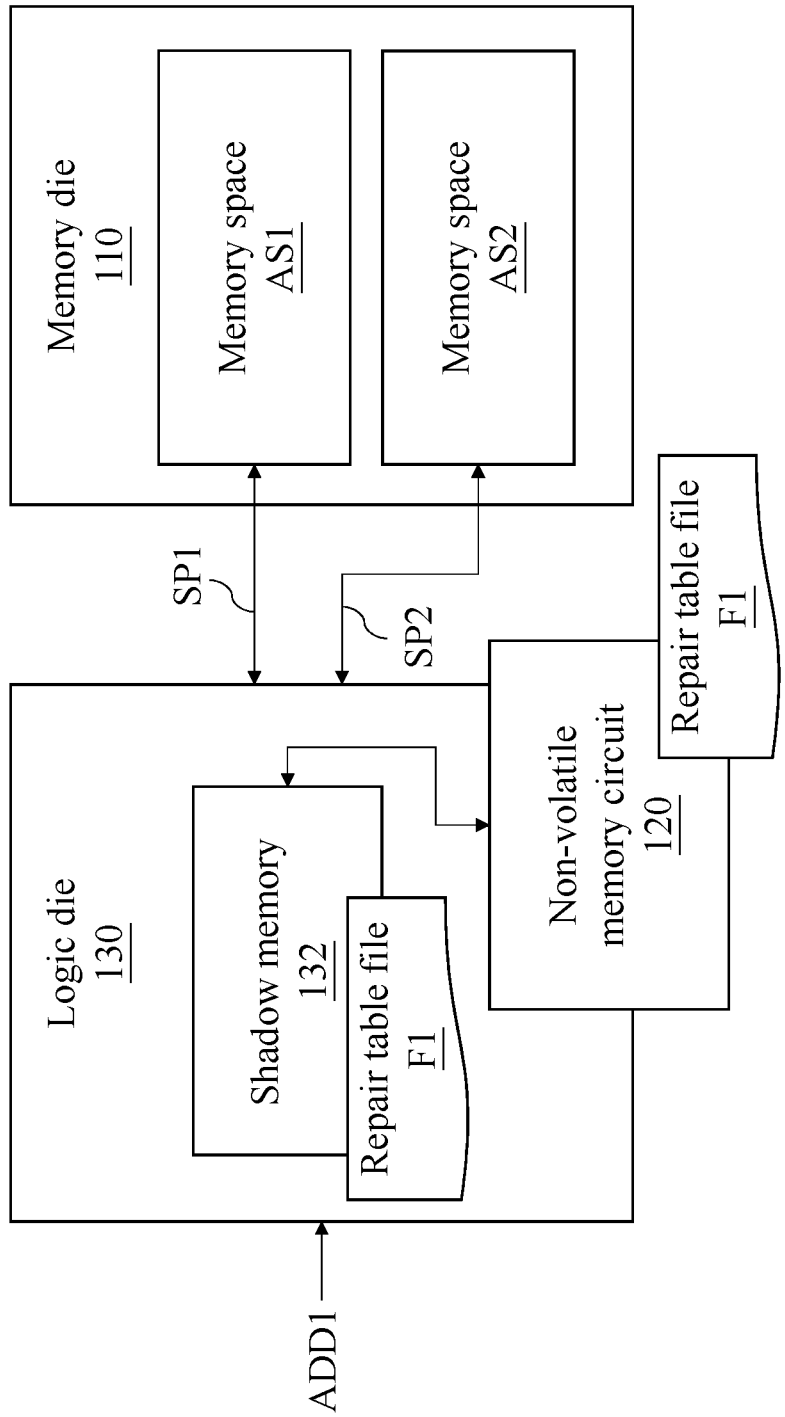
FIG. 1 shows a memory device according to one embodiment of the present disclosure.

FIG. 1 shows a memory device 100 according to one embodiment of the present disclosure. The memory device 100 comprises a memory die 110, a non-volatile memory circuit 120, and a logic die 130.

In the present embodiment, the memory die 110 comprises a first memory space AS1 and a second memory space AS2 provided by a plurality of dynamic random-access memory (DRAM) cells. Normally, when the memory device 100 receives an input address ADD1, the logic die 130 would access the input address ADD1 in the first memory space AS1. However, due to uncontrollable defects, some of the addresses in the first memory space AS1 may cause failure, that is, data stored in the DRAM cells of such defective (or "failed") addresses may not be able to be accessed correctly.

In some embodiments, the failed addresses of first memory space AS1 may be detected in advance and may be recorded in a repair table file F1. Furthermore, the repair table file F1, which may be a look-up table, may also record a specific address in the second memory space AS2 correspondingly for each of the addresses that may cause failure. Therefore, if the input address ADD1 matches an address recorded in the repair table file F1, it means that the input address ADD1 in the first memory space AS1 may not be accessed correctly or the memory cells corresponding to the input address ADD1 in the first memory space AS1 may be defective. In such case, instead of accessing the original input address ADD1 in the first memory space AS1, the logic die 130 would refer to the repair table file F1 to select a specific address in the second memory space AS2 for replacing the original input address ADD1. That is, the logic die 130 may compare the input address to the addresses recorded in the repair table file F1, and the logic die 130 may selectively access the first memory space AS1 or the second memory space AS2 of the memory die 110 according a comparing result of the input address and the repair table file F1. For example, if the comparing result indicates that the input address ADD1 matches an address recorded in the repair table file F1, the logic die 130 may access the second memory space AS2 of the memory die 110 using the specific address. If the comparing result indicates that the input address ADD1 does not match an address recorded in the repair table file F1, the logic die 130 may access the first memory space AS1 of the memory die 110 using the original input address.

Consequently, if some of the addresses in the first memory space AS1 cannot be accessed correctly, the second memory space AS2 may serve as a back-up space for read or write operations by referencing the repair table file F1 without changing or re-sending the input address. As the second memory space AS2 is an additional memory space intentionally created for backing up the defective memory cells in the first memory space AS1, the memory size of the second memory space AS2 is much smaller than the first memory space AS1.

In one embodiment, the first memory space AS1 and the second memory space AS2 may be accessed by the logic die 130 through the same address pins (i.e. the same signal path) that externally coupling between the logic die 130 and the memory die 110. In such embodiment, the logic die 130 may selectively access the first memory space AS1 or the second memory space AS2 via the address pins according to the above mentioned comparing result. Specifically, by using the same signal path to assign the address spaces, the logic die 130 may access an input address in the first memory space AS1 when the comparing result indicates that the input address does not match an address recorded in the repair table file F1, and may access a specific address or a predetermined address in the second memory space AS2 when the comparing result indicates that the input address matches an address recorded in the repair table file F1.

In another embodiment, the first memory space AS1 and the second memory space AS2 may be accessed by the logic die 130 through the different address pins (i.e. the different signal paths) that externally coupling from the logic die 130 to the first memory space AS1 and the second memory space AS2 respectively. In such embodiment, the logic die 130 may selectively access the first memory space AS1 or the second memory space AS2 via the different address pins according to the above mentioned comparing result.

For descriptive purposes, in FIG. 1, the address pins are illustrated by two signal paths, i.e. a first signal path SP1 and a second signal path SP2, that couple between the logic die 130 and the memory die 110, in which the first signal path SP1 is connected between the first memory space AS1 and the logic die 130, and the second signal path SP2 is connected between the second memory space AS2 and the logic die 130. It is noted that the first signal path SP1 and the second signal path SP2 may be implemented by the same signal path or two physically different paths.

As shown in FIG. 1, the logic die 130 may access an input address in the first memory space AS1 through the first signal path SP1 when the comparing result indicates that the input address does not match an address recorded in the repair table file F1, and may access a specific address or a predetermined address in the second memory space AS2 through the second signal path SP2 when the comparing result indicates that the input address matches an address recorded in the repair table file F1.

Furthermore, in the present embodiment, the repair table file F1 corresponding to the first memory space AS1 may be stored in the non-volatile memory circuit 120, so that the data in the repair table file F1 may be preserved even when the memory device 100 is powered off. In some embodiments, the non-volatile memory circuit 120 may be a one-time programmable memory (OTP). In such case, the repair table file F1 may be permanently written to the non-volatile memory circuit 120 with corresponding hardware equipment. However, in some other embodiments, the non-volatile memory circuit 120 may be a multiple-lime programmable (MTP) memory so the repair table file F1 may be updated according to system needs.

Furthermore, compared to volatile memories, non-volatile memories, for both OTP memories and MTP memories, may have lower access speed and may require higher voltages for read operations. To overcome this problem, as shown in FIG. 1, the logic die 130 may be configured to include a shadow memory 132. The shadow memory 132 may be a static random-access memory (SRAM) that includes a plurality of SRAM cells. The shadow memory 132 is arranged to shadow or to duplicate a copy of the repair table file F1 stored in the non-volatile memory circuit 120 when the memory device 100 is powered up. Therefore, a copy of the repair table file F1 may be stored or loaded into the shadow memory 132 when the memory device 100 is powered up. In such case, instead of accessing the non-volatile memory circuit 120, the logic die 130 may retrieve the copy of the repair table file F1 from the shadow memory 132, and thus, the logic die 130 may compare the input address and the copy of the repair table file F1 to generate the comparing result. As a result, the logic die 130 may retrieve the required data more quickly and with less power consumption. However, in some embodiments, if the power consumption and accessing speed of the non-volatile memory circuit 120 is acceptable, then the shadow memory 132 may be omitted and the logic die 130 may access the non-volatile memory circuit 120 directly whenever needed.

In the present embodiment, the memory die 110 and the logic die 130 are different dies and may be fabricated by different semiconductor manufacturing processes. For example, since the memory die 110 includes a plurality of DRAM cells, the memory die 110 may be fabricated by a semiconductor manufacturing process that is able to form high-quality capacitors required by the DRAM cells. Furthermore, since the logic die 130 needs to perform logic operations to determine whether to access the first memory space AS1 or the second memory space AS2 every time the memory device 100 receives an input address, the speed of the logic die 130 must be high enough so as not to delay the read operation or the write operation. In the present embodiment, the logic die 130 may be fabricated by a semiconductor manufacturing process designed for logic elements required by the logic die 130. For example, but not limited thereto, the logic die 130 may be fabricated by a complementary metal-oxide semiconductor (CMOS) process, so the logic die 130 may have a higher operating speed and a lower power consumption. Consequently, the memory die 110 may have a higher memory cell density, and the logic die 130 may provide better controlling performance.

Figure 2:
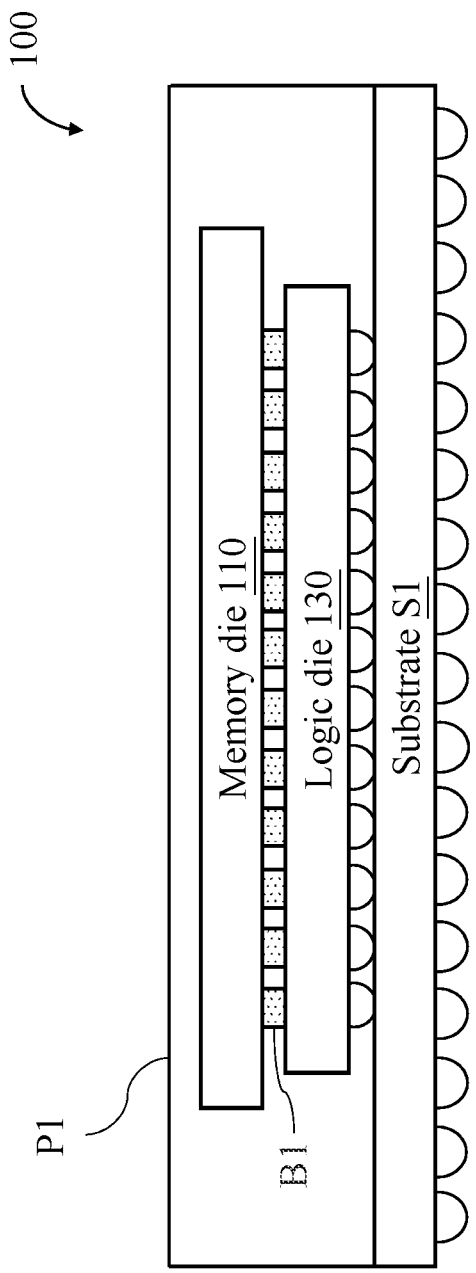
FIG. 2 shows a package of the memory device according to one embodiment of the present disclosure.

FIG. 2 is a cross-section diagram showing a package P1 configured for packaging the memory device 100 according to one embodiment of the present disclosure. As shown in FIG. 2, the memory device 100 further includes a substrate S1, which may be a semiconductor substrate. In this embodiment, the memory die 110 is stacked over the logic die 130 via the interconnecting structures B1. However, this is not a limitation of the present invention, in another embodiment, the logic die 130 may be stacked over the memory die 110 via the interconnecting structures B1. A stacking or combination of the logic die 130 and the memory die 110 may be disposed on the substrate S1. The combination of the logic die 130 and the memory die 110 may be coupled to the substrate S1 through a plurality of conductive bumps. However, this is not a limitation of the present invention. The combination of the logic die 130 and the memory die 110 may be coupled to the substrate S1 through any kind of interconnecting structures, e.g. bonding pads or micro bumps. As shown in FIG. 2, the memory die 110 and the logic die 130 are disposed in a same package P1 using a 3D integrated circuit (IC) packaging technology. In such case, the memory device 100 further includes a plurality of interconnecting structures B1 sandwiched between the memory die 110 and the logic die 130 for electrically connecting the memory die 110 and the logic die 130 as shown in FIG. 2.

It is noted that, in the present invention, the interconnecting structures B1 may be formed during the process of 3D packaging technology. Therefore, the interconnecting structures B1 may be any kind of vertical die-to-die interconnect provided by the 3D packaging technology. For example, the interconnecting structures B1 may be wafer-to-wafer bonding pads, chip-to-wafer bonding pads, micro-bumps formed during the slacking from chip to wafer, micro-bumps formed during the stacking from chip to chip, etc.

For example, the first signal path SP1 may be comprised of some interconnecting structures B1 so that the first memory space AS1 in the memory die 110 and the logic die 130 can be connected. Similarly, the second signal path SP2 may be comprised of some interconnecting structures B1 so that the second memory space AS2 in the memory die 110 and the logic die 130 can be connected.

Figure 3:
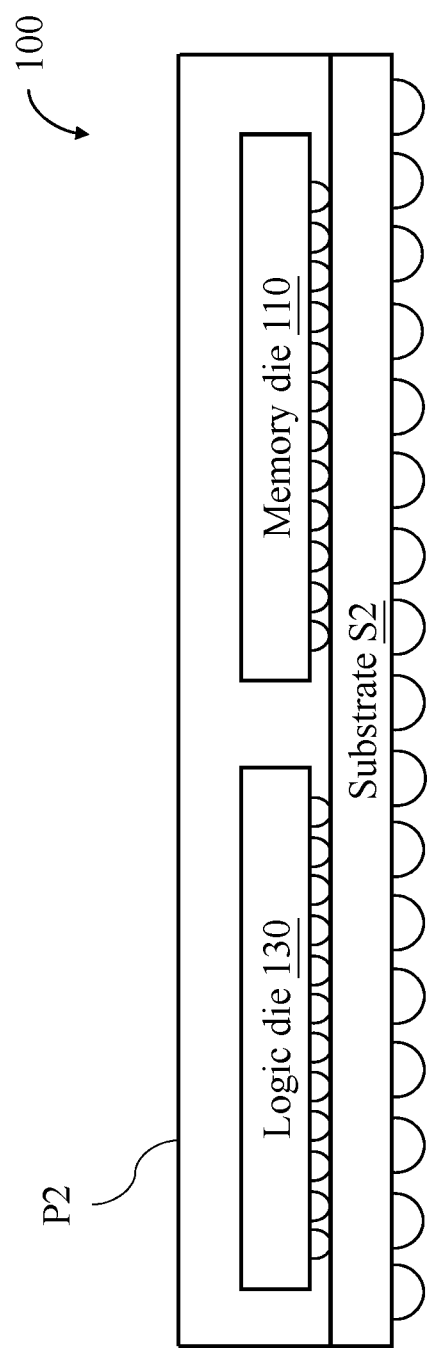
FIG. 3 shows a package of the memory device according to another embodiment of the present disclosure.

However, in some other embodiments, the memory die 110 and the logic die 130 may be arranged in alternative ways or according to other packaging technologies. FIG. 3 is a cross-section diagram showing a package P2 configured for packaging the memory device 100 according to another embodiment of the present disclosure. As shown in FIG. 3, the memory die 110 and the logic die 130 may be disposed side-by-side on a substrate S2, which may be a semiconductor substrate, and the memory die 310 may be laterally near the logic die 130. The logic die 130 and the memory die 110 may be coupled to the substrate S2 through a plurality of conductive bumps. However, this is not a limitation of the present invention. In such case, the memory die 110 is coupled to the logic die 130 through conductive layers (e.g. signal paths SP1 and SP2) formed on/in the substrate S2. That is, the memory die 110 and the logic die 130 may be disposed in the same package P2 with a 2.5D integrated circuit (IC) packaging technology.

In another embodiment, the substrate may be a printed circuit board (PCB), and the memory die 110 and the logic die 130 may be disposed side by side on the PCB and coupled to each other via conductive traces on the PCB.

Figure 4:
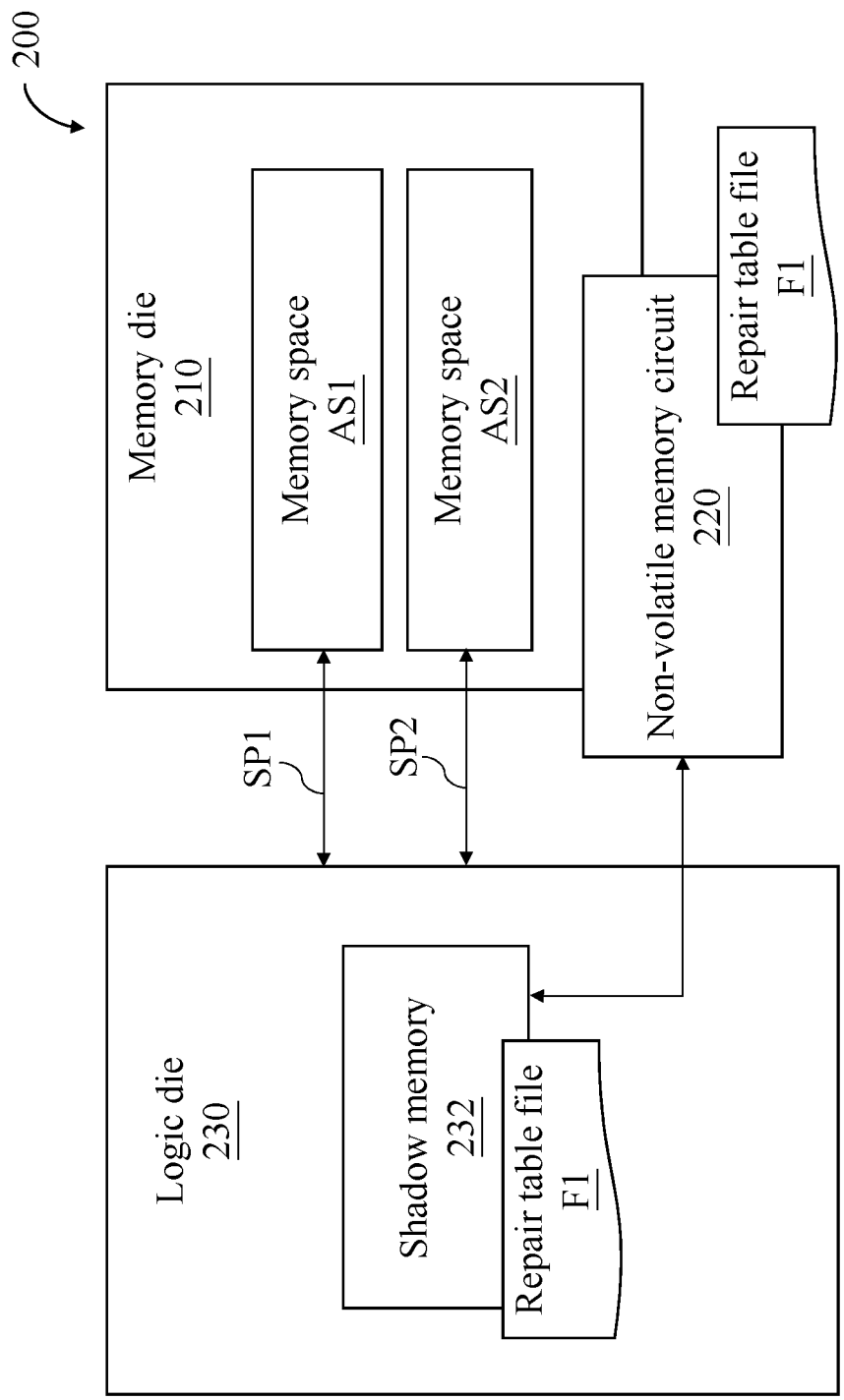
FIG. 4 shows a memory device according to another embodiment of the present disclosure.

Although the non-volatile memory circuit 120 can be disposed in the logic die 130 as show in FIG. 1, the present disclosure is not limited thereto. In some other embodiments, the non-volatile memory circuit 120 may be disposed in other dies. FIG. 4 shows a memory device 200 according to another embodiment of the present disclosure. The memory device 200 and the memory device 100 have similar structures and can be operated with similar mechanism. However, the non-volatile memory circuit 220 is disposed in the memory die 210 instead of the logic die 230. In such case, since the shadow memory 232 may shadow or duplicate a copy of the repair table file F1 when the memory device 200 is powered up, the logic die 230 may retrieve the copy of the repair table file F1 locally without accessing the non-volatile memory circuit 220 in the memory die 210.

Figure 5:
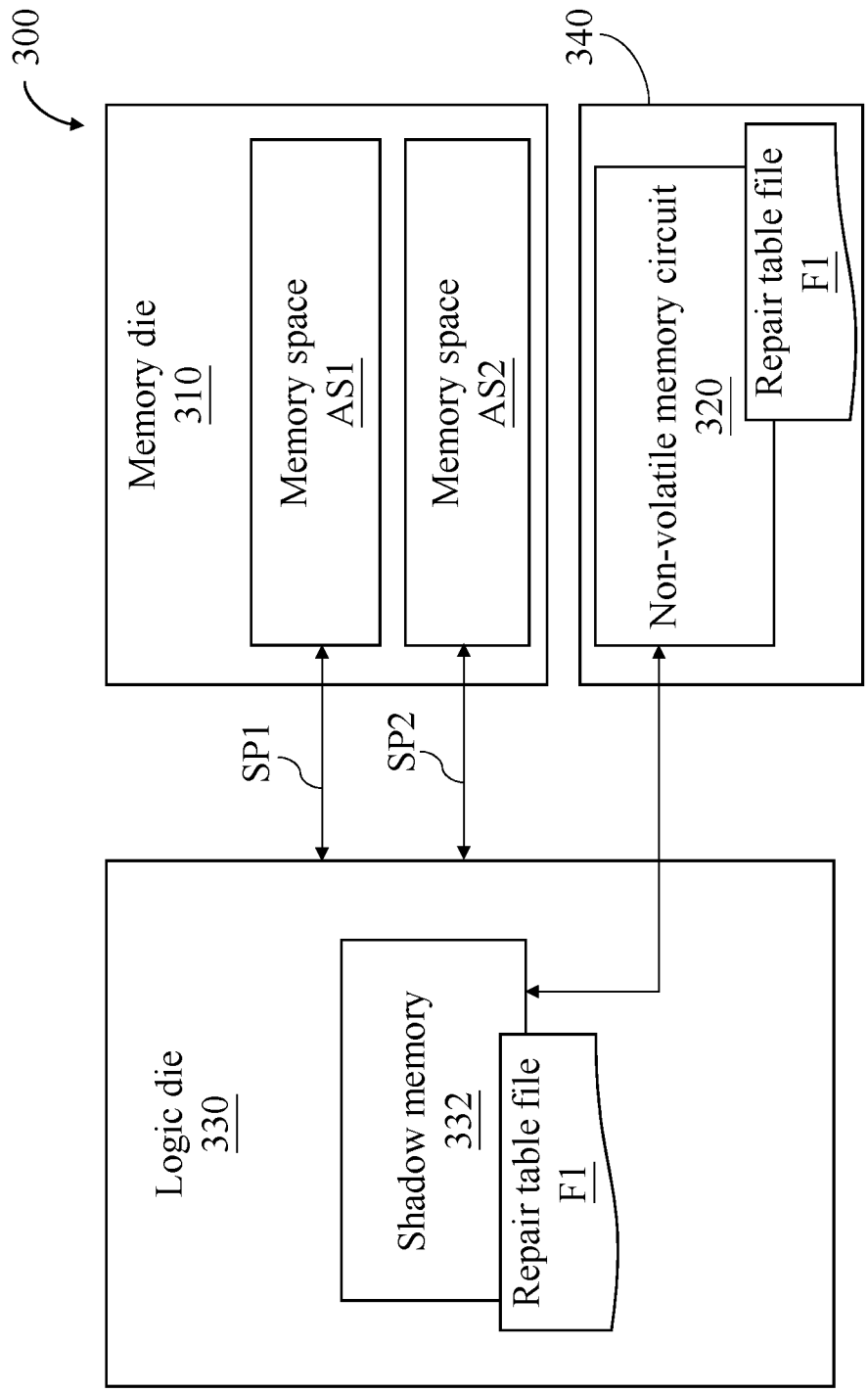
FIG. 5 shows a memory device according to another embodiment of the present disclosure.

FIG. 5 shows a memory device 300 according to another embodiment of the present disclosure. The memory device 300 and the memory device 100 have similar structures and may be operated with similar mechanism. However, the non-volatile memory circuit 320 is formed in a die 340 different from the memory die 310 and the logic die 330. In such case, since the shadow memory 332 may shadow or duplicate a copy of the repair table file F1 when the memory device 300 is powered up, the logic die 330 may retrieve the copy of the repair table file F1 locally without accessing the non-volatile memory circuit 320 in the die 340. Furthermore, since the non-volatile memory circuit 320 is formed in the die 340, the non-volatile memory circuit 320 may be fabricated by a semiconductor manufacturing process more suited to the non-volatile memory circuit 320. For example, the non-volatile memory circuit 320 may be fabricated by a high-voltage process to ensure that cells of the non-volatile memory circuit 320 can be operated stably at high voltage.

In some embodiments, since the defects causing the failed addresses of the memory die may largely relate to the manufacturing process of the memory die, each of memory dies may have its own corresponding repair table file. For example, the repair table file F1 should only be valid for the memory die 110 and should not be used for other memory dies. In such case, to ensure that the logic die 130 can retrieve data from the correct repair table file corresponding to the memory die 110, the memory die 110 may further include an electronic identification (EID) for recording an identification of the memory die 100. As a result, the repair table file F1 may be stored to the non-volatile memory circuit 120 in related to the EID of the memory die 110, and the logic die 130 may select or recognize the repair table file F1 correctly according to the EID. According to the embodiment, the EID may be an active or a passive fuse circuit formed in the memory die 110. Moreover, the EID of the memory die 110 may be assigned and programmed prior, during, or after the testing operation of the memory die 110. A controller or the logic die 130 may recognize the memory die 110 after the EID of the memory die 110 is programmed.

Figure 6:
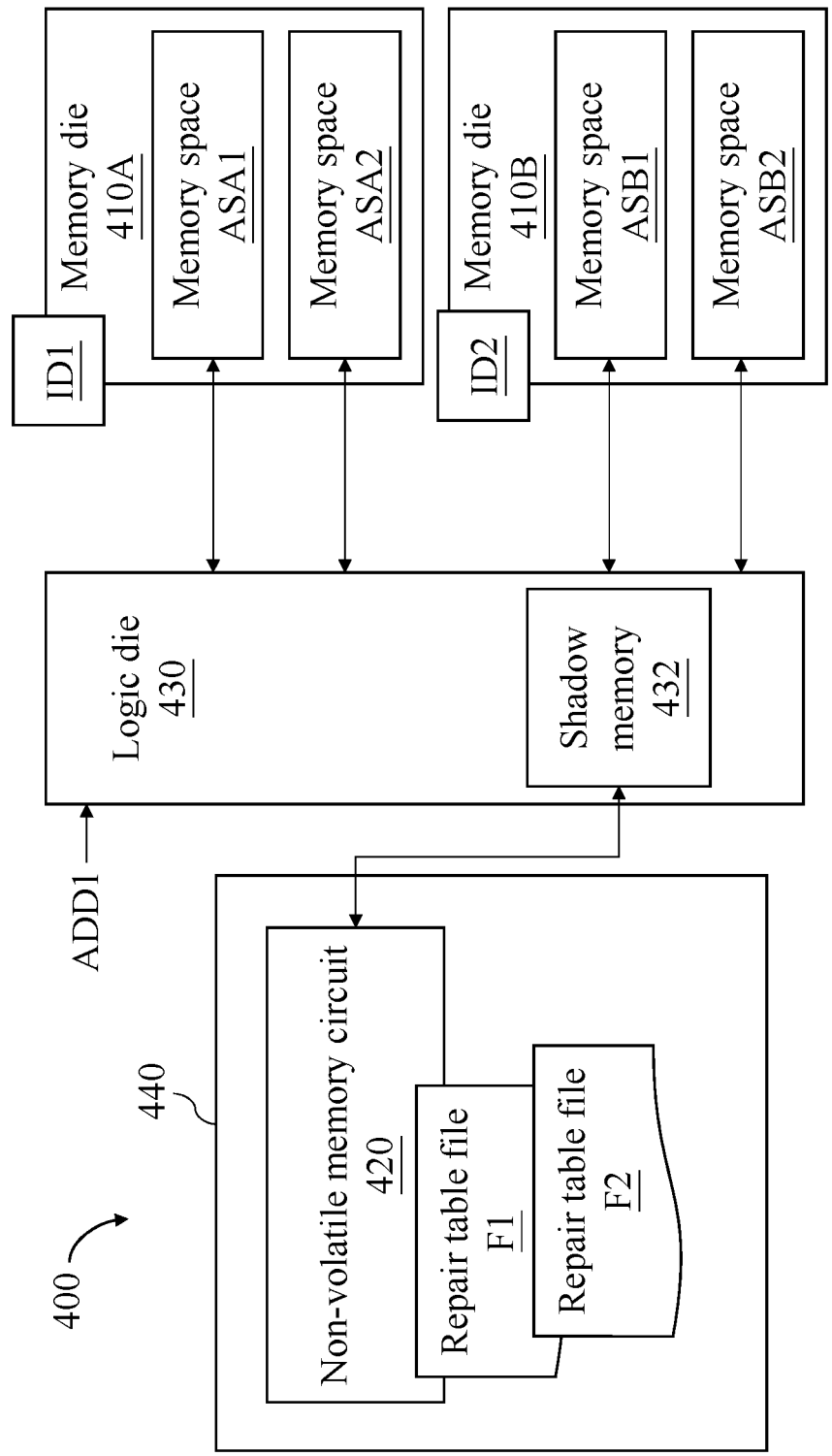
FIG. 6 shows a memory device according to another embodiment of the present disclosure.

FIG. 6 shows a memory device 400 according to another embodiment of the present disclosure. The memory deuce 400 and the memory device 100 have similar structures and can be operated according to similar mechanism. However, the memory device 400 includes two memory dies 410A and 410B. The memory die 410A has two memory spaces ASA1 and ASA2, and the memory die 410B has two memory spaces ASB1 and ASB2. Furthermore, the memory die 410A includes an EID ID1 and the memory die 410B includes an EID ID2. The EIDs ID1 and ID2 may record the identifications of the memory dies 410A and 410B respectively. Therefore, the non-volatile memory circuit 420 may store the repair table file F1 corresponding to the memory space ASA1 of the memory die 410A in conjunction with the EID ID1, and may store the repair table file F2 corresponding to the memory space ASB1 of the memory die 410B in conjunction with the EID ID2.

In the present embodiment, since addresses in the memory space ASA1 of the memory die 410A are different from addresses in the memory space ASB1 of the memory die 410B, the logic die 430 may select the repair table file F1 corresponding to the memory space ASA1 or the repair table file F2 corresponding to the memory space ASB1 according to the receiving input address ADD1. After the corresponding repair table file is selected, the logic die 430 may further compare the input address ADD1 with the selected repair table file. If the repair table file F1 is selected, the logic die 430 would selectively access the memory space AS1 or AS2 of the memory die 410A according to the comparing result of the input address ADD1 and the repair table file F1. Otherwise, if the repair table file F2 is selected, the logic die 430 would selectively access the memory space ASB1 or ASB2 of the memory die 410B according to the comparing result of the input address ADD1 and the repair table file F2.

Furthermore, in the present embodiment, since the shadow memory 432 may shadow or duplicate a copy of the repair table files F1 and F2, the logic die 430 may retrieve the data of the copy of the repair table file F1 or F2 in the shadow memory 432 locally when the logic die 430 determines to select the repair table file F1 or F2.

In addition, as shown in FIG. 6, the non-volatile memory 420 is formed in a die 440 different from memory dies 410A and 410B and the logic die 430. However, the present disclosure is not limited thereto. In some embodiments, the non-volatile memory 420 may be formed in the memory die 410A, the memory die 410B, or the logic die 430.

Figure 7:
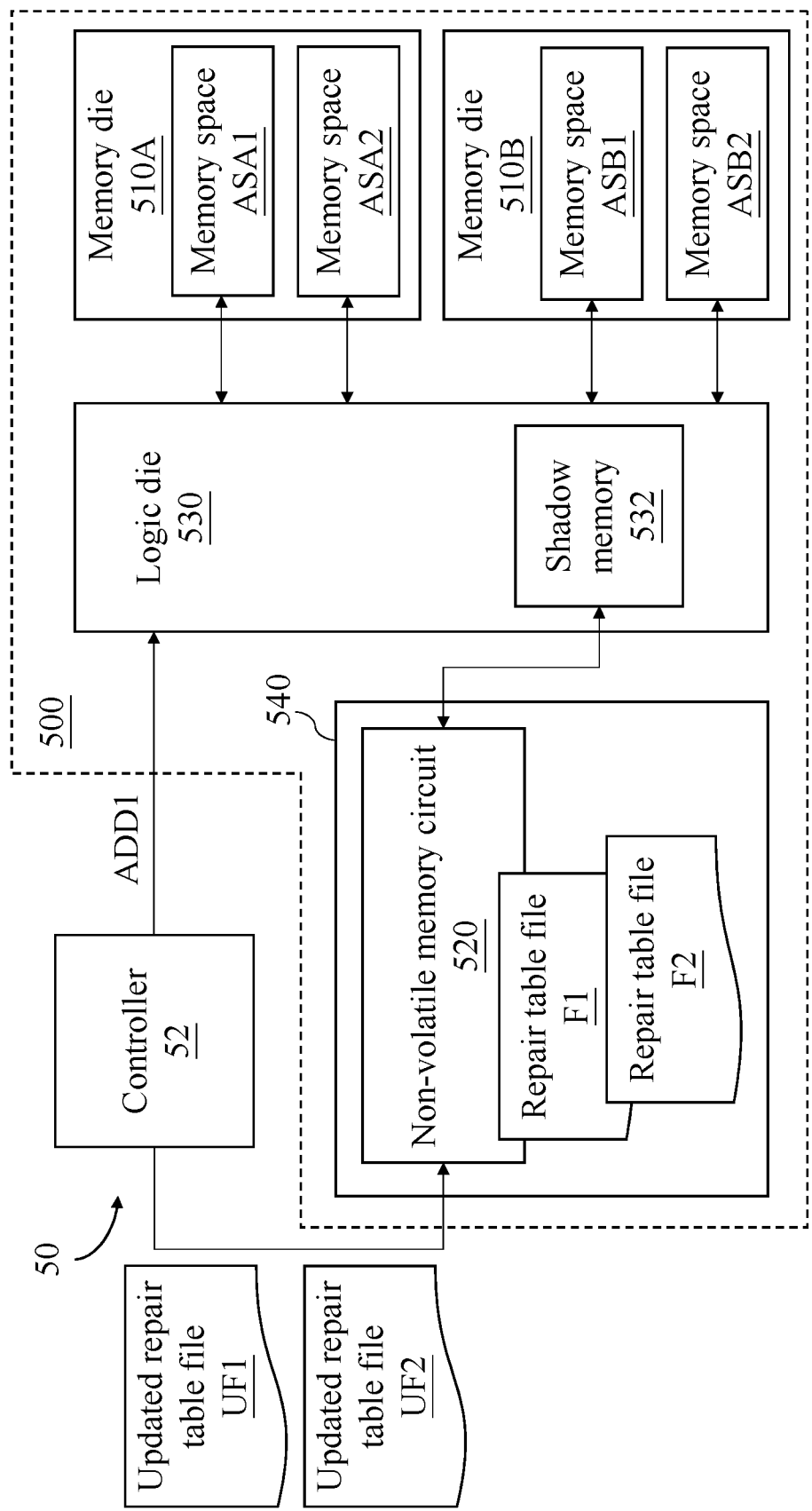
FIG. 7 shows a memory system according to one embodiment of the present disclosure.

FIG. 7 shows a memory system 50 according to one embodiment of the present disclosure. The memory system 50 includes a memory device 500 and a controller 52. In the present embodiment, the controller 52 may be a memory controller and may generate the input address ADD1 according to a memory access request of the memory system 50. Furthermore, in some embodiments, the controller 52 may further overwrite the repair table file F1 or F2 in the non-volatile memory circuit 520 with an updated repair table file. For example, after the memory system 50 has operated for a period of time, the controller 52 may instruct the memory dies 510A and 510B to perform self-test operations to detect actual failure conditions of the memory dies 510A and 510B so as to generate updated repair table files UF1 and UF2 accordingly. In such case, the controller 52 may overwrite the repair table files F1 and F2 stored in the non-volatile memory circuit 520 with the updated repair table files UF1 and UF2, thereby ensuring the reliability of the memory system 50. Also, after the updated repair table files UF1 and UF2 are stored to the non-volatile memory circuit 520, the shadow memory 532 may shadow copies of the updated repair table files UF1 and UF2 stored in the non-volatile memory circuit 520 accordingly, so the logic die 530 may retrieve data in the copy of the updated repair table files UF1 and UF2 locally in the shadow memory 532.

In some embodiments, the self-test operations conducted by the controller 52 may be performed m an actual operating condition of the memory system 50. However, a testing condition used for generating the previous repair table files F1 and F2 may be much stricter than the actual operating environment; for example, the testing temperature used for generating the previous repair table files F1 and F2 may be much higher than the actual operating environment. Therefore, some of the failed addresses recorded in the previous repair table files F1 and F2 may not be included in the updated repair table files UF1 and UF2. In such case, the updated repair table files UF1 and UF2 may not only improve the reliability of the memory system 50 but also increase the utilization efficiency of the memory dies 510A and 510B.

Furthermore, in some embodiments, instead of instructing the memory dies 510A and 510B to perform self-test operations, the controller 52 may scan the memory dies 510A and 510B to generate updated repair table files UF1 and UF2. For example, the user may create his/her own definition for failed addresses according to the actual needs, and the controller 52 may scan the memory dies 510A and 510B to detect the failed addresses according to the user-created definition. Consequently, the controller 52 may generate the updated repair table files UF1 and UF2 accordingly to replace the repair table files F1 and F2, thereby increasing the utilization efficiency of the memory dies 510A and 510B to meet the actual needs.

In addition, in some embodiments, end users of the memory device 500 may download the updated repair table files UF1 and UF2 through OTA firmware update provided by the manufacturer of the memory dies 510A and 510B, and the controller 52 may overwrite the repair table files F1 and F2 stored in the non-volatile memory circuit 520 with the updated repair table files UF1 and UF2 when the updated repair table files UF1 and UF2 are received. For example, if the manufacturer of the memory dies 510A and 510B finds that some columns or some rows of the memory cells are more vulnerable for a same batch of dies, and would like to add addresses of such cells to the corresponding repair table files, then the manufacturer may notify the end user of the need to download the firmware update file. That is, the manufacturer of the memory dies 510A and 510B may keep updating the repair table files even after the memory dies 510A and 510B are shipped and assembled. Furthermore, since the firmware updating operations may be performed online, the reliability of the memory system 50 may be further improved.

As shown in FIG. 7, the non-volatile memory circuit 520 can be formed in the die 540 different from memory dies 510A and 510B and the logic die 530. However, in some other embodiments, the non-volatile memory circuit 520 can be formed in the logic die 530, the memory die 510A or the memory die 510B.

Figure 8:
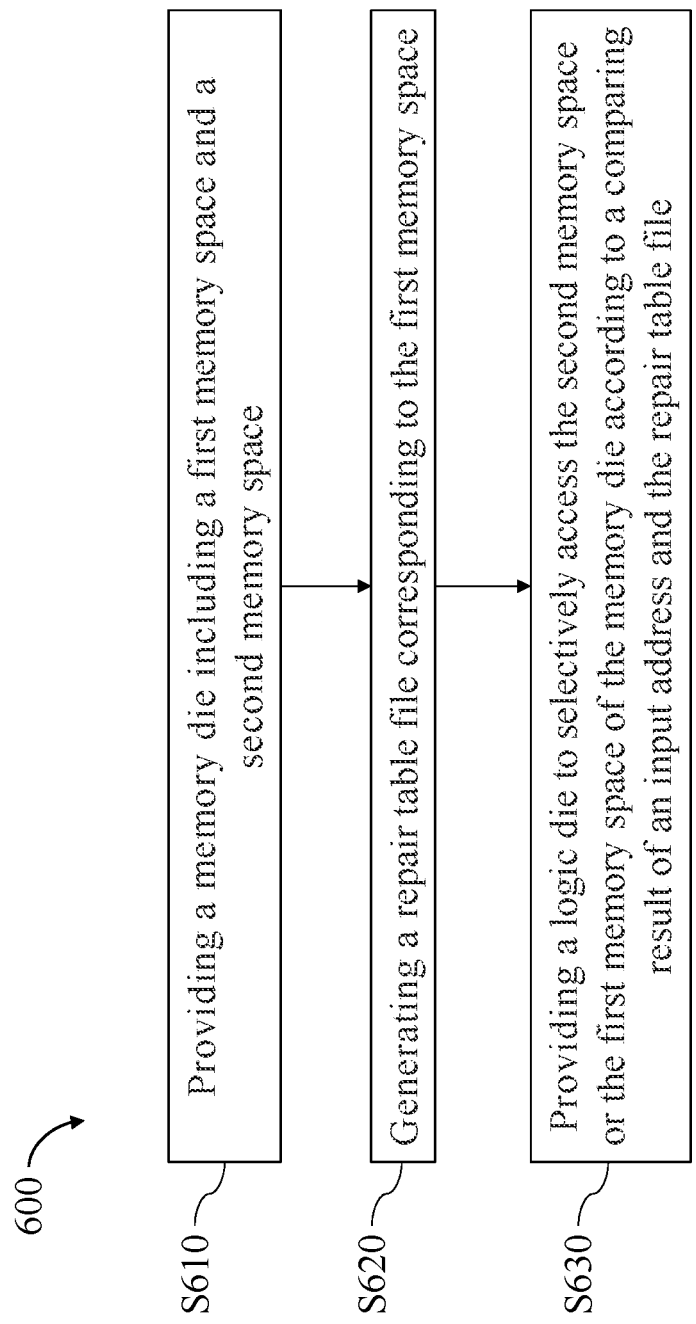
FIG. 8 shows a flowchart of a method of controlling a memory device according to one embodiment of the present disclosure.

FIG. 8 shows a flowchart of a method 600 of controlling a memory device according to one embodiment of the present disclosure. The method 600 includes step S610 to S630. Provided that substantially the same result is achieved, the operations of the flowchart shown in FIG. 8 may not follow the same order and may not be contiguous. In some embodiments, other intermediate operations may be included. In this embodiment, the method 600 may be used to control the memory devices 100, 200, 300, or 400. For example, if the method 600 is adopted to control the memory device 100 shown in FIG. 1, the memory die 110 including the memory spaces AS1 and AS2 may be provided in step S610, and the repair table file F1 that corresponds to the memory die 110 may be generated in step S620. Consequently, in step S630, the logic die 130 may access the memory space AS1 or AS2 of the memory die 110 according to a comparing result of the input address ADD1 and the repair table file F1.

Figure 9:
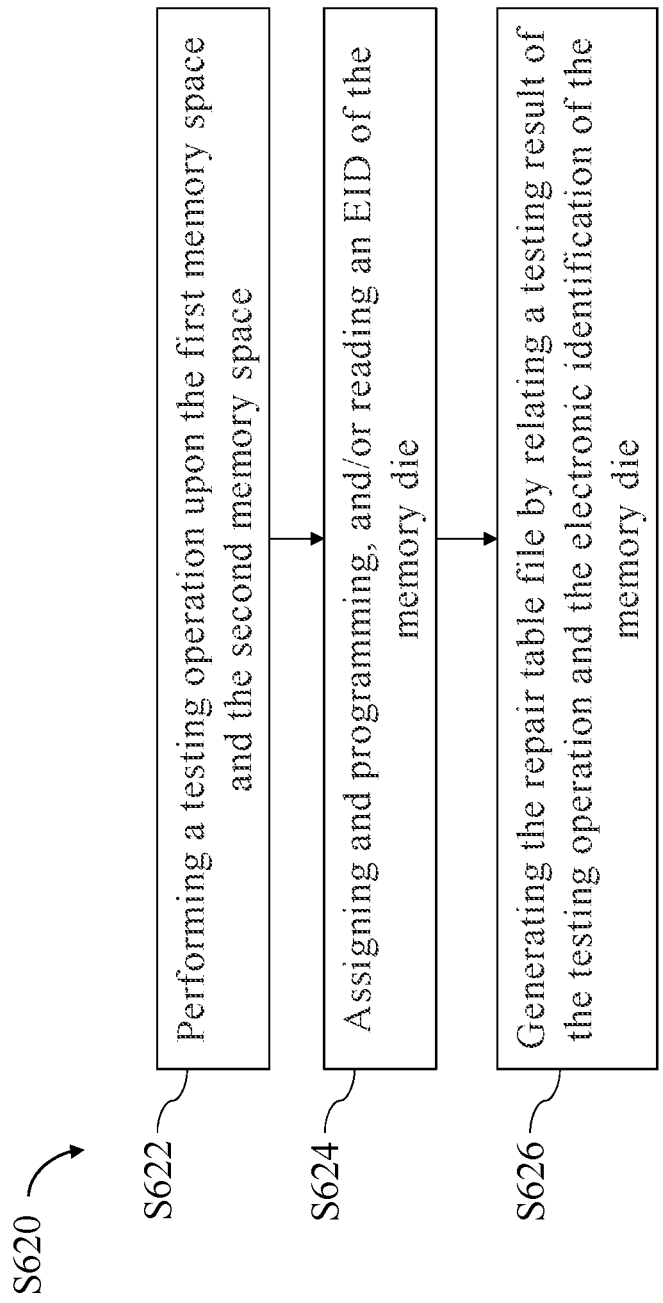
FIG. 9 shows sub-steps for generating the repair table file according to one embodiment of the present disclosure.

FIG. 9 shows sub-steps of step S620 for generating the repair table file according to one embodiment of the present disclosure. As shown in FIG. 9, a testing operation may be performed upon the memory space AS1 of the memory die 110 in sub-step S622, and the EID of the memory die 110 may be read in sub-step S624. In sub-step S622, the testing operation may also be performed upon the second memory space AS2 of the memory die 110 in order to detect the unusable or failed memory cells and the corresponding addresses in the second memory space AS2. The failed memory addresses of the second memory space AS2 are excluded from the backup addresses in the repair file F1 such that failed memory addresses of the second memory space AS2 may not be selected by the logic die 130.

It is noted that the EID of the memory die 110 may be assigned and programmed prior, during, or after the testing operation (i.e. sub-step S622) of the memory die 110. When the EID of the memory die 110 is assigned and programmed prior and during the testing operation of the memory die 110, the EID of the memory die 110 may be directly read out in sub-step S624.

On the other hand, when the EID of the memory die 110 is not assigned and programmed prior or during the testing operation of the memory die 110, the assigning and programming of the EID of the memory die 110 may be performed in sub-step S624. In such case, the sub-step S624 may further include the operations of assigning and programming, and/or reading the EID of the memory die 110.

Afterwards, in sub-step S626, the repair table file F1 may be generated according to the result of the testing operation and in related to the EID of the memory die 110, thereby allowing the logic die 130 to select the repair table file F1 that corresponds to the memory die 110 correctly.

Figure 10:
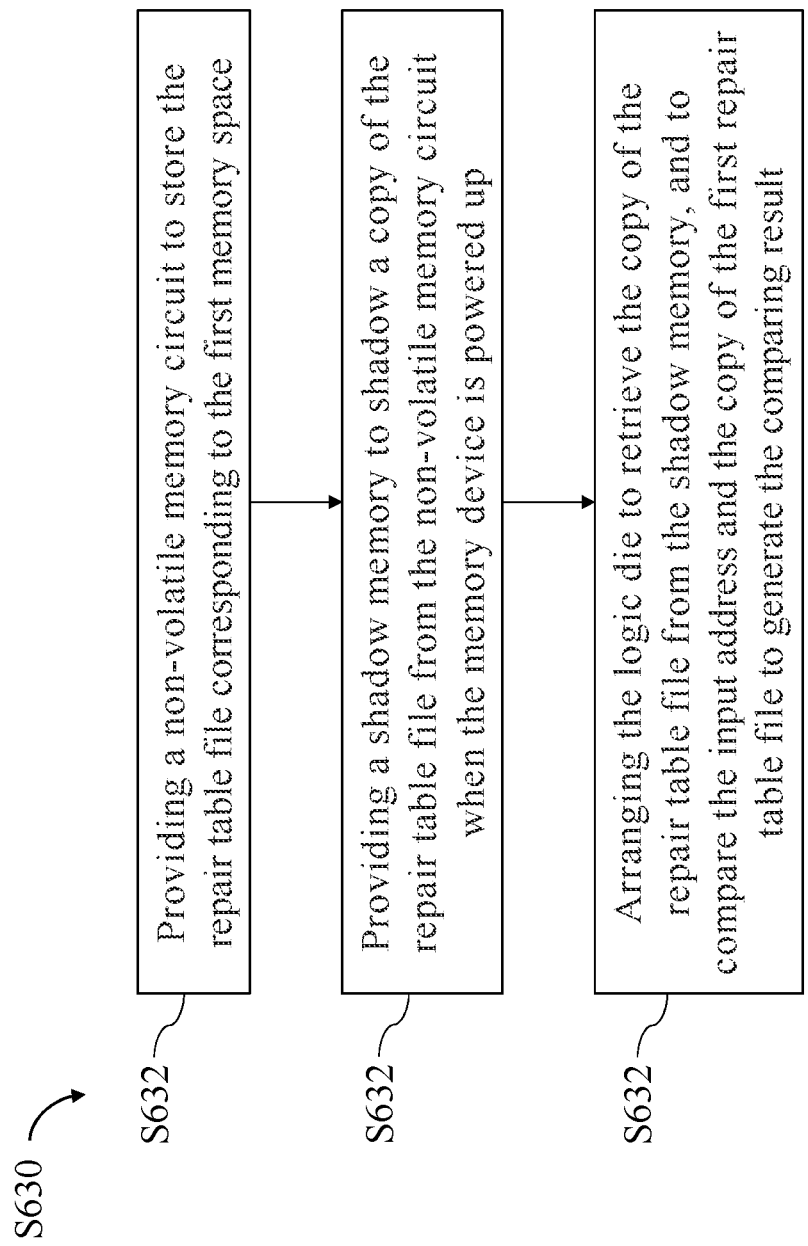
FIG. 10 shows sub-steps of step for providing the logic die to access the memory spaces of the memory die according to one embodiment of the present disclosure.

FIG. 10 shows sub-steps of step S630 for providing the logic die to access the memory spaces of the memory die according to one embodiment of the present disclosure. As shown in FIG. 10, in sub-step S632, the non-volatile memory circuit 120 is provided to store the repair table file F1, and the shadow memory 132 is provided in sub-step S634 to shadow a copy of the repair table file F1 when the memory device 100 is powered up. Afterwards, the logic die 130 may retrieve the copy of the repair table file F1 from the shadow memory 132 locally and quickly, and may compare the input address ADD1 and the copy of the repair table file F1 to generate the comparing result. Consequently, the logic die 130 may access the memory space AS1 or AS2 according to the comparing result in step S630.

In summary, the memory devices, the memory systems, and the methods for controlling memory devices provided by the embodiments of the present disclosure allow manufacturing of the logic die and the memory dies by different suitable processes, so the efficiency of the logic die and the density of the memory dies can both be improved. Furthermore, by using multiple-programmable non-volatile memory to store the repair table files of the memory dies, the user is able to update the repair table files according to the current needs, thereby improving the efficiency and the reliability of the memory device and the memory system.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods or steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
    a first memory die including a first memory space and a second memory space;
    a second memory die different from the first memory die, and the second memory die including a third memory space and a fourth memory space;
    a non-volatile memory circuit configured to store a first repair table file corresponding to the first memory space and a second repair table file corresponding to the third memory space; and
    a logic die coupled to the first memory die and the non-volatile memory circuit, the logic die configured to select one of the first repair table file and the second repair table file as a selected repair table file according to an input address, and to selectively access the second memory space or the first memory space of the first memory die or selectively access the third memory space or the fourth memory space of the second memory die according to a comparing result of the input address and the selected repair table file;
    wherein the first memory die is different from the logic die, and the non-volatile memory circuit is not disposed in the first memory die.

2. The semiconductor device of claim 1, wherein;
    the non-volatile memory circuit is formed in the logic die; or
    the non-volatile memory circuit is formed in a third die different from the first memory die and the logic die.

3. The semiconductor device of claim 1, further comprising:
a plurality of interconnecting structures, sandwiched between the first memory die and the logic die for electrically connecting the first memory die and the logic die.

4. The semiconductor device of claim 1, further comprising;
a first signal path, configured to connect the first memory space and the logic die; and
a second signal path, configured to connect the second memory space and the logic die;
wherein the logic die is configured to access the input address in the first memory space through the first signal path when the comparing result indicates that the input address does not match an address recorded in the first repair table file, and the logic die is configured to access a specific address in the second memory space through the second signal path when the comparing result indicates that the input address matches an address recorded in the first repair table file.

5. The semiconductor device of claim 4, wherein the specific address is recorded in the first repair table file.

6. The semiconductor device of claim 4, wherein the first signal path are comprised of a plurality of first interconnecting structures sandwiched between the first memory die and the logic die, and the second signal path are comprised of a plurality of second interconnecting structures sandwiched between the first memory die and the logic die.

7. The semiconductor device of claim 1, wherein:
the first memory die further comprises a first electronic identification (EID) for recording a first identification of the first memory die; and
the first repair table file is stored in the non-volatile memory circuit in related to the first identification of the first memory die.

8. The semiconductor device of claim 7, wherein:
the second memory die further comprising a second electronic identification (EID) for recording a second identification of the second memory die.

9. The semiconductor device of claim 1, wherein the non-volatile memory circuit is a multiple-time programmable (MTP) memory.

10. The semiconductor device of claim 1, wherein:
the logic die comprises a shadow memory configured to shadow a copy of the first repair table file from the non-volatile memory circuit when the semiconductor device is powered up; and
the logic die is configured to retrieve the copy of the first repair table file from the shadow memory, and to compare the input address and the copy of the first repair table file to generate the comparing result.

11. The semiconductor device of claim 10, wherein the shadow memory comprises a plurality of static random-access memory (SRAM) cells.

12. The semiconductor device of claim 1, wherein the first memory die comprises a plurality of dynamic random-access memory (DRAM) cells.

13. The semiconductor device of claim 1, further comprising a substrate, wherein one of the first memory die and the logic die is stacked over the other of the first memory die and the logic die via a plurality of interconnecting structures, and a combination of the first memory die and the logic die is disposed on the substrate.

14. The semiconductor device of claim 1, further comprising a substrate, wherein the first memory die and the logic die are disposed on the substrate, and the first memory die is laterally near the logic die.

15. A method of controlling a semiconductor device, the method comprising:
providing a first memory die including a first memory space and a second memory space;
providing a second memory die including a third memory space and a fourth memory space;
generating a first repair table file corresponding to the first memory space;
generating a second repair table file corresponding to the third memory space;
providing a non-volatile memory circuit to store the repair table file corresponding to the first memory space, wherein the non-volatile memory circuit is not disposed in the memory die; and
providing a logic die to select one of the first repair table file and the second repair table file as a selected repair table file according to an input address; and
arranging the logic die to selectively access the second memory space or the first memory space of the memory die or selectively access the third memory space or the fourth memory space of the second memory die according to a comparing result of the input address and the selected repair table file, wherein the logic die is different from the memory die.

16. The method of claim 15, wherein the step of generating the first repair table file corresponding to the first memory space comprises:
performing a testing operation upon the first memory space;
reading an electronic identification (EID) of the memory die; and
generating the first repair table file by relating a testing result of the testing operation and the electronic identification of the memory die.

17. The method of claim 15, wherein the step of arranging the logic die to selectively access the second memory space or the first memory space of the memory die or selectively access the third memory space or the fourth memory space of the second memory die according to the comparing result of the input address and the selected repair table file comprises:
providing a shadow memory to shadow a copy of the first repair table file from the non-volatile memory circuit when the semiconductor device is powered up; and
arranging the logic die to retrieve the copy of the first repair table file from the shadow memory, and to compare the input address and the copy of the first repair table file to generate the comparing result when the selected repair table file is the first repair table file.

\* \* \* \* \*